US 6,418,024 B2

(12) United States Patent
Edevold et al.

(10) Patent No.: US 6,418,024 B2
(45) Date of Patent: *Jul. 9, 2002

(54) HEAT SINK APPARATUS AND METHOD OF ATTACHING THE HEAT SINK APPARATUS TO A DEVICE

(75) Inventors: Craig Edevold, Tomah; Cary Winch, Necedah, both of WI (US)

(73) Assignee: Powerware Corporation, Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/815,635

(22) Filed: Mar. 23, 2001

Related U.S. Application Data

(63) Continuation of application No. 09/347,828, filed on Jul. 2, 1999, now Pat. No. 6,219,246.

(51) Int. Cl.⁷ .................................................. H05K 7/20
(52) U.S. Cl. ...................... 361/707; 165/80.2; 165/185; 174/16.3; 257/726; 361/690; 361/715
(58) Field of Search ............................... 165/80.2, 80.3, 165/185; 174/16.3; 257/707, 713, 718–719, 726–727; 361/688, 690, 704, 707, 709–710, 715, 719–720

(56) References Cited

U.S. PATENT DOCUMENTS

| | | | |
|---|---|---|---|
| 4,701,829 A | 10/1987 | Bricaud et al. ............. 361/386 |
| 4,872,089 A | 10/1989 | Ocken et al. ............... 361/388 |
| 4,899,255 A | 2/1990 | Case et al. .................. 361/386 |
| 4,972,294 A | 11/1990 | Moses, Jr. et al. .......... 361/386 |
| 4,979,073 A | 12/1990 | Husted ........................ 361/386 |
| 5,172,756 A | 12/1992 | Jayamanne et al. ........ 165/80.3 |
| 5,343,362 A | 8/1994 | Solberg ....................... 361/710 |
| 5,461,541 A | 10/1995 | Wentland, Jr. et al. ..... 361/707 |
| 5,864,464 A | 1/1999 | Lin ............................. 361/697 |
| 5,875,097 A | 2/1999 | Amaro et al. ............... 361/704 |
| 5,886,870 A | 3/1999 | Omori ......................... 361/704 |
| 6,219,246 B1 * | 4/2001 | Edevold et al. ............. 361/707 |
| 6,252,773 B1 * | 6/2001 | Werner ........................ 361/704 |

* cited by examiner

*Primary Examiner*—Gregory Thompson
(74) *Attorney, Agent, or Firm*—Leydig, Voit & Mayer, Ltd.

(57) ABSTRACT

A heat sink apparatus for drawing heat from one or more devices and a method of attaching such a heat sink to one or more devices is provided. The heat sink includes a mounting surface, which draws heat into the heat sink where it is dissipated by fins. The heat sink can be mounted next to the device to be cooled with minimum insertion force since the weight of the heat sink is borne by the printed circuit board upon which the electronic device is installed. A rotatable cam is turned by the user, which engages a pivot arm. The pivot arm rotates a number of spring clips against the device thereby holding it in place. Onceina fully closed position, the cam locks into place to prevent the pivot arm and spring clips from rotating back to an open position. The spring clips affix the heat sink and maintains contact between the mounting surface and the device being cooled. The individually articulated spring clips allow the heat sink to be mounted over multiple devices of various dimensions and locations along the heat sink.

19 Claims, 3 Drawing Sheets

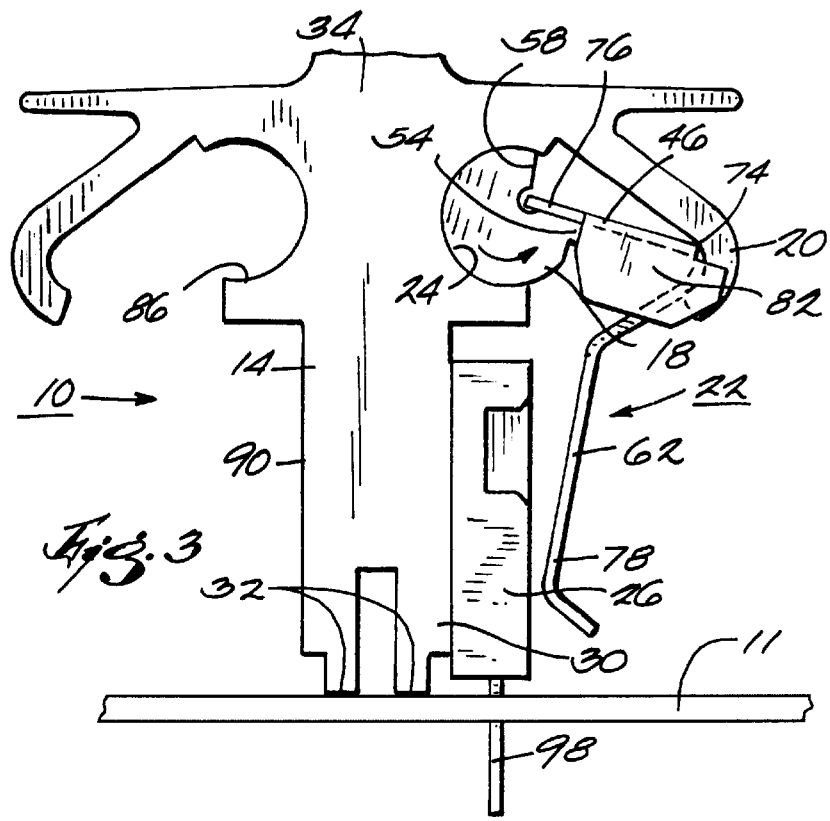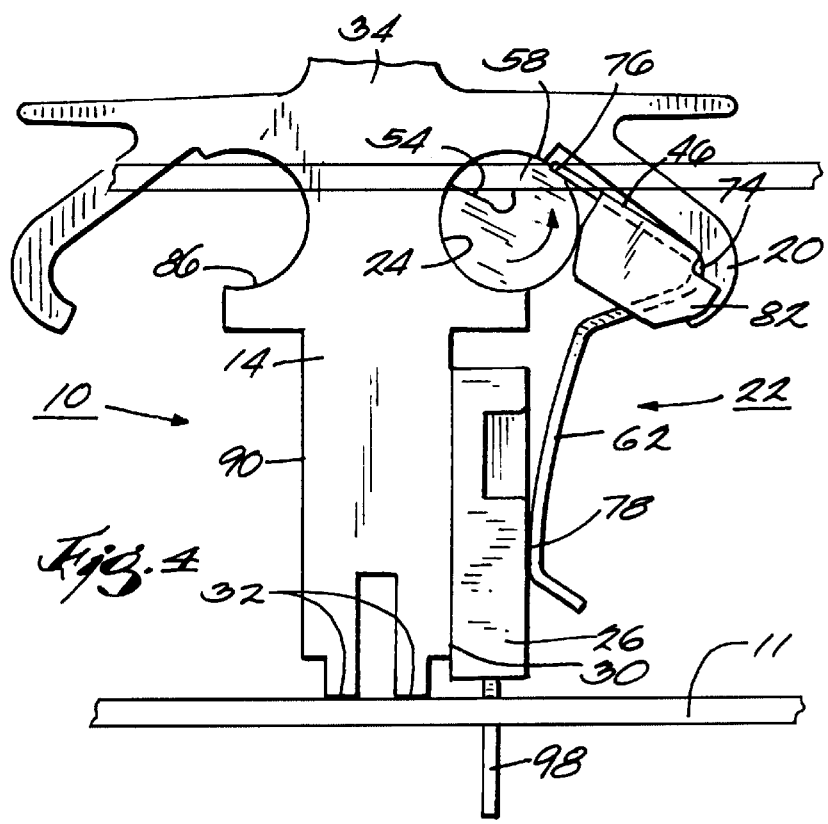

HEAT SINK APPARATUS AND METHOD OF ATTACHING THE HEAT SINK APPARATUS TO A DEVICE

RELATED APPLICATION

This is a continuation of Application No. 09/347,828, filed on Jul. 2, 1999, now U.S. Pat. No. 6,219,246 which is incorporated in its entirety by reference.

BACKGROUND OF THE INVENTION

The invention relates to heat sinks and a method of attaching a heat sink to a device in order to allow the heat sink to draw heat away from the device. In particular, the invention relates to a heat sink which can be mounted and dismounted with minimum insertion force and which has a resilient holding member for securing the heat sink to the device, and to a method of mounting the heat sink.

It is commonly known in the art to connect a heat sink to various mechanical or electrical machines or devices in order to draw heat away from the machine or device. Many electronic devices fail if the temperature of the device rises above a particular temperature. Specifically, integrated circuits, capacitors, power amplifiers and other electronic components generate heat as electric current passes through the component. That heat must be dissipated in order to allow the device to operate normally.

SUMMARY OF THE INVENTION

In the case of electrical devices such as integrated circuits that are soldered to a printed circuit board, commonly known methods of connecting a heat sink to the device often causes stress on the package or on the leads connecting the package to the printed circuit board.

Commonly known heat sink devices in the art require a high insertion force, a mounting surface external to the device being cooled or must be mounted prior to soldering the package to the circuit board. Exemplary devices are shown and described in U.S. Pat. Nos. 4,872,089, 4,899,255, 4,972,294, 5,864,464, 5,875,097, and 5,886,870.

Accordingly, the invention provides a heat sink apparatus for drawing heat away from a device, and means for connecting the heat sink apparatus to a device with minimal insertion force. In particular, the means for connecting the heat sink apparatus to the device includes a mounting surface and a resilient holding member pivotally connected to the mounting surface for adjustable movement between a clamped position and a released position. In a preferred embodiment, the heat sink further includes a cam with a cam engagement surface, a removable user-operated cam actuator connected to the cam and a holding member which includes a pivot arm and spring clips. Rotational movement of the cam actuator is translated into horizontal movement of the holding member between the clamped and released positions to secure and release, respectively, the heat sink from the device.

The user of individual spring clips allows the heat sink to be mounted to multiple devices of different styles, shapes and at different locations along the mounting surface. Individual spring clips which do not engage a device pivotally rotate towards the mounting surface, but do not become compressed and do not contribute to the clamping of the heat sink.

The invention also provides a method of securing a heat sink apparatus to a device, the heat sink apparatus having a resilient holding member and a mounting surface, the method including placing the heat sink on the device so that the device is positioned between the mounting surface and the resilient holding member and rotating the cam actuator, thereby moving the resilient holding member between the released position and the clamped position to secure the heat sink to the device. In a preferred embodiment the heat sink includes cooling fins to provide a greater surface area to dissipate heat into the surrounding air.

In an alternative embodiment the cooling capability of the cooling fins on the heat sink could be supplemented with a power-actuated fan. Such power-actuated fans are well known in the art. In an additional alternative embodiment, a temperature monitor could be installed on the heat sink to monitor and report the operating temperature of the heat sink, thereby indicating the relative internal operating temperature of the device. Inclusion of such a monitor would ensure that the device was operating within safe operational temperature parameters and would allow for user intervention prior to device failure. Such temperature monitors are well known in the art.

It is a principal advantage of the invention to provide a heat sink that can be secured to a device either before or after soldering the device to a printed circuit board without stressing the device or device leads during installation.

It is another advantage of the invention to provide a heat sink that can be removed from a device after mounting the heat sink to the device on a printed circuit board without stressing the device or device leads during heat sink removal.

It is another advantage of the invention to provide a heat sink capable of simultaneously clamping a plurality of devices of varying styles to the heat sink.

It is another advantage of the invention to provide a heat sink that does not require front access to the device to mount the heat sink to the device.

It is yet another advantage of the invention to provide a heat sink that can be secured to the device without any additional hardware or external mounting surfaces.

Various other features and advantages of the invention are set forth in the following detailed description, drawings and claims.

BRIEF DESCRIPTION OF THE DRAWINGS

FIG. 3 is a view similar to FIG. 2 showing the heat sink apparatus positioned over a device.

FIG. 4 is a view similar to FIG. 3 showing the heat sink apparatus positioned over the device and being clamped to the device.

Figure 1:
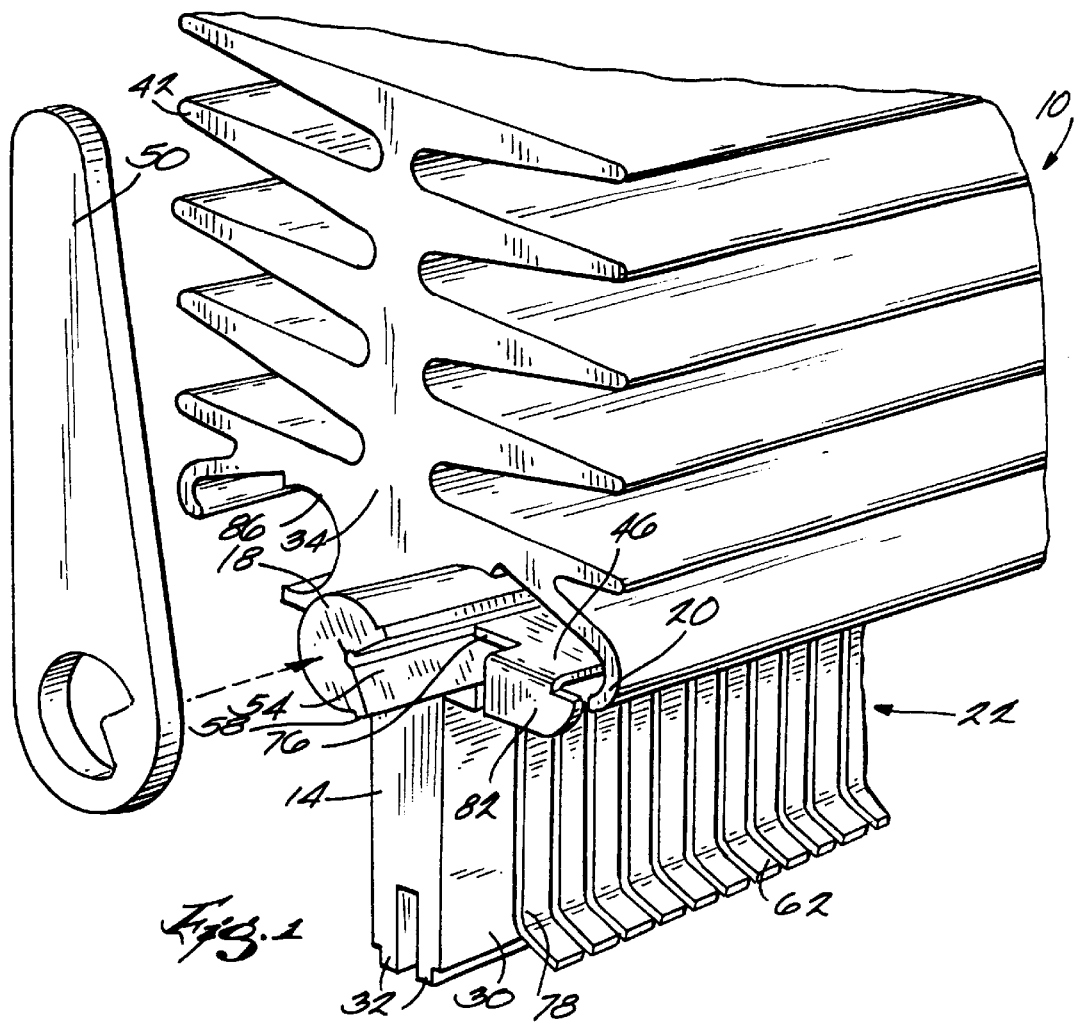
FIG. 1 is a partial perspective view of the heat sink apparatus embodying the invention, and showing a tool for operating the heat sink apparatus.

Before one embodiment of the invention is explained in detail, it is to be understood that the invention is not limited in its application to the details of the construction and the arrangements of the components set forth in the following description or illustrated I the drawings. The invention is capable of other embodiments and of being practiced or being carried out in various ways. Also, it is to be understood that the phraseology and terminology used herein is for the purpose of description and should not be regarded as limiting.

DETAILED DESCRIPTION OF THE PREFERRED EMBODIMENT

As seen in FIGS. 1 through 4 the heat sink apparatus 10 embodying the invention includes a body 14 and means for securing the heat sink apparatus 10 to a device to conduct heat away from the device. Thee means for securing includes a cam 18 and a holding member 22. The body 14 has a length which may be reduced or enlarged according to the application to accommodate any number of devices 26.

Figure 5:
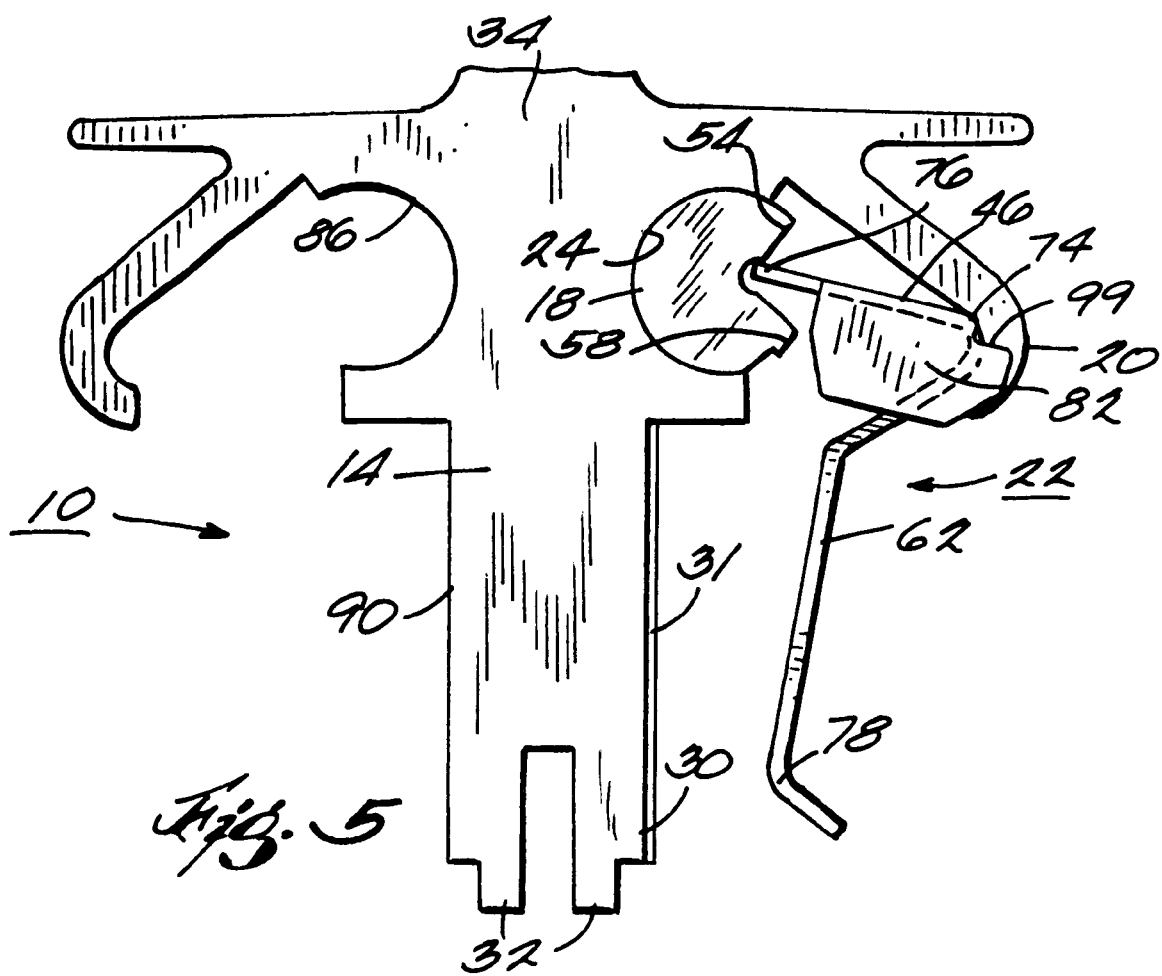
FIG. 5 is a side elevational view of an alternate embodiment of the heat sink apparatus shown in FIG. 1.

The body 14 is preferably manufactured from a dense, thermally conductive material. The body 14 includes a mounting surface 30. As seen in FIGS. 3 and 4, the mounting surface 30 contacts the device 26 once the heat sink apparatus 10 is mounted adjacent to the device 26. In one embodiment illustrated in FIG. 5, a thermally conductive, electrically insulating material 31 is applied to the mounting surface 30 before the heat sink is secured to the device. Typically, the thermally conductive, electrically insulating material 31 is applied as an adhesively bonded sheet or label. Such materials are commonly commercially available. In other embodiments (not shown), the mounting surface is actually made from a thermally conductive, electrically insulating material.

The body 14 also includes a base 32. The base 32 provides a surface for supporting the heat sink apparatus 10 on a printed circuit board 11 (see FIGS. 3 and 4) As seen in FIG. 1, the base 32 of the body 14 is machined to provide a small surface area. In the embodiment depicted, the entire body 14 is machined, extruded or cast from single piece of aluminum.

The body 14 also includes a heat sink 34. The heat sink 34 is partially depicted in FIGS. 2 through 4 and more completely depicted in FIG. 1. As best seen in FIG. 4, the heat sink 34 includes a number of cooling fins 42 which extend from the body 14.

The body 14 also includes a cam channel 24. The cam channel 24 is a recess formed between the body 14 and the heat sink 34. The cam channel 24 extends along the entire length of the body 14, and is shaped to accommodate a cylindrical cam 18 pivotally mounted in the cam channel 24 for axial rotation.

As seen in FIG. 1, the cam 18 is a cylindrical member machined, extruded or cast to a length slightly longer than the body 14 of the heat sink apparatus 10. As seen in FIGS. 1 through 4, the cam 18 includes a V-shaped engagement surface 54 which runs the entire length of the cam 18.

The cam 18 also includes a grooved, recessed portion 58 which runs across the entire length of the cam 18. The portion 58 prevents reverse rotation of the cam 18 in the cam channel 24.

A portion of the cam 18 extends beyond the body 14 to provide an interface with a cam actuator 50. In the embodiment shown, the cam actuator 50 is a wrench having a socket designed to accept the cross-sectional shape of the cam 18. In the embodiment depicted, the cam 18 is machined, extruded or cast from a single piece if aluminum.

The heat sink apparatus 10 also includes a holding member retainer 20 connected to the body 14 and a holding member 22 mounted in the holding member retainer 20. Preferably, the holding member retainer 20 and holding member 22 extend along the length of the body 14.

The holding member 22 is a resilient member that mechanically biases the device 26 against the mounting surface 30. The holding member 22 is manufactured from a single, flat piece of metal pressed and formed into a curved shape to define a pivot arm 46 and a spring clip. or clips 62 connected to the pivot arm 46 at a curved portion 74. In the embodiment shown, the holding member 22 is manufactured from stainless spring steel. The holding member 22 is pivotally movable in the cam channel 24 between a released position as shown in FIG. 3 and a clamped position as shown in FIG. 4.

Figure 2:
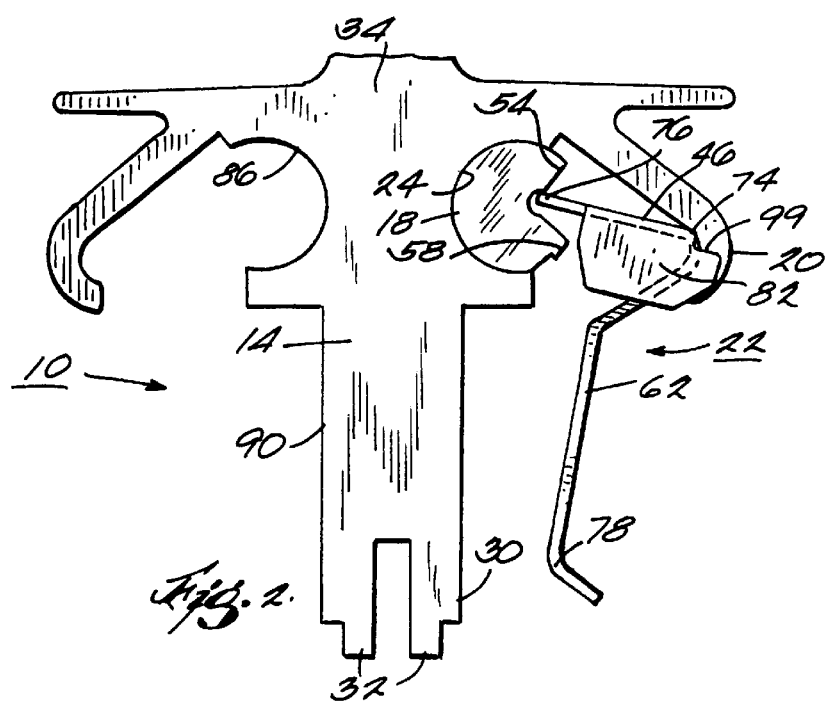
FIG. 2 is a side elevational view of the heat sink apparatus shown in FIG. 1.

Curved portion 74 engages pivot portion 99 of the inside of the cam channel 24 formed by the holding member retainer 20. As best depicted in FIG. 2, the pivot arm 46 includes an end 76 that extends into the vortex of the V-shaped engagement surface 54 of the cam 18.

As seen in FIGS. 1 through 4, the spring clips 62 extend beyond the cam channel 24 in spaced relation to the mounting surface 30. In the embodiment shown in the drawings, the ends of the spring clips 62 are slightly curved away from the mounting surface 30 to provide an engagement surface 78 with the device 26.

As shown in the drawings, the holding member includes a holding member stop 82 on each end of the pivot arm 46 of the holding member 22 to secure the holding member 22 in the cam channel 24. The holding member stop 82 is a flat piece of the pivot arm 46 formed perpendicular to the pivot arm 46. The holding member stop 82 provides a surface to engage the body 14 thereby securing the holding member 22 in the cam channel 24.

As seen in FIGS. 1 through 4, the heat sink apparatus 10 includes a second cam channel 86 and second mounting surface 90 to accommodate a second cam (not shown) and second holding member (not shown). The second cam (not shown) pivotally engages a second holding member (not shown) which engages a second device (not shown) in substantially the same method and manner as cam 18 and holding member 22.

In general, the method of mounting the heat sink to a device includes positioning the heat sink adjacent to the device, and biasing the holding member toward the mounting surface so as to clamp the device between the mounting surface of the heat sink and the holding member. The ability to secure the heat sink to a device by clamping the device between the mounting surface of the heat sink and the holding member reduces the risk that the thermally conductive, electrically insulating material will be damaged during installation of the heat sink.

More specifically, the heat sink apparatus 10 is supported on the printed circuit board 11 so that the device 26 is positioned between mounting surface 30 and holding member 22. The heat sink apparatus 10 is then secured to the device 26 by rotating the cam 18 with the cam actuator 50. As seen in FIG. 1, the cam actuator 50 has an opening or socket therein that is shaped to fit the cam 18. Turning again to FIGS. 3 and 4, rotation of the cam 18 causes the cam engagement surface 54 to engage the pivot arm 46 which rotates the pivot arm 46 inside the cam channel 24 thereby causing the holding member 22 to pivot into the clamped position (as seen in FIG. 4). Engagement of recessed portion 58 with end 76 of pivot arm 46 prevents release of said holding member 22 and reverse-rotation of the cam 18. The pivot arm 46 translates the rotational movement of the cam 18 into the clamping action of the holding member 22. The flexible spring clips 62 bias the device 26 against the mounting surface 30 so that heat generated by the device 26 is transferred to the body 14 to dissipated into the ambient environment by heat sink 34. With further rotation of the cam, the end 76 returns to the V-shaped surface 54 thereby returning the holding member 22 to the released position as shown in FIG. 2. The heat sink apparatus 10 can then be easily removed without stressing the device 26 or the device leads 98.

Mounting the heat sink apparatus 10 in the manner described above ensures maximum contact and thermal transfer between the mounting surface 30 and the device 26 thereby allowing heat generated by the device 26 to be conducted through the mounting surface 30 and body 14 into the heat sink 34 and away from the device 26. In the embodiment depicted, the mounting surface 30 and heat sink 34 provide a dense material to conduct thermal energy away from the device 26 while the cooling fins 42 provide a greater surface area for the heat sink 34 to dissipate the heat into the surrounding air.

In other embodiments (not shown), the heat sink may include means for sensing the temperature of the heat sink or of the device. Such means may include any type of known temperature sensor, and this sensor may be connected to a control circuit for operating a cooling fan. Triggering of the control circuit by the temperature causes operation of the fan to blow cooling air over the heat sink to further facilitate cooling of the device.

Various features and advantages of the invention are set forth in the following claims.

What is claimed is:

1. A heat sink apparatus, comprising:
a thermally conductive body having a mounting surface;
means for resiliently holding a circuit element, said means pivotally connected to said body for adjustable movement between a clamped position and a released position, said released position defining a first distance from said mounting surface greater than a second distance defined by said clamped position; and
wherein said means comprises a cam rotatably mounted within a cam channel defined in said body and a holding member, said holding member defining a pivot arm portion and a spring clip portion, said cam operable in relation to said body and said pivot arm portion to position said spring clip portion in said clamped position and in said released position.

2. The apparatus of claim 1, wherein said body further defines a holding member retainer, and wherein said holding member pivotally engages said holding member retainer.

3. A heat sink apparatus, comprising:
a thermally conductive body having a mounting surface;
means for resiliently holding a circuit element, said means pivotally connected to said body for adjustable movement between a clamped position and a released position, said released position defining a first distance from said mounting surface greater than a second distance defined by said clamped position; and
wherein said means comprises a cam rotatably mounted within a cam channel defined in said body and a holding member, said holding member defining a pivot arm portion and a spring clip portion, said cam operable in relation to said body and said pivot arm portion to position said spring clip portion in said clamped position and in said released position; and
wherein said spring clip portion defines a plurality of individual spring clips.

4. The apparatus of claim 1, wherein rotation of said cam through a first arc positions said holding member in said clamped position, and rotation of said cam through a second arc positions said holding member in said released position, and wherein said second arc is substantially greater than said first arc.

5. The apparatus of claim 1, wherein said cam is rotatable in a first direction to transition said holding member from said released position to said clamped position, and wherein said cam is prohibited from rotating in a second direction once said holding member is in said clamped position.

6. A heat sink apparatus, comprising:
a thermally conductive body having a mounting surface;
means for resiliently holding a circuit element, said means pivotally connected to said body for adjustable movement between a clamped position and a released position, said released position defining a first distance from said mounting surface greater than a second distance defined by said clamped position; and
wherein said means comprises a cam rotatably mounted within a cam channel defined in said body and a holding member, said holding member defining a pivot arm portion and a spring clip portion, said cam operable in relation to said body and said pivot arm portion to position said spring clip portion in said clamped position and in said released position; and
wherein said means further comprises a holding member stop formed perpendicular to said pivot arm, said holding member stop adapted to engage said body to thereby secure said holding member in said cam channel.

7. The apparatus of claim 1, wherein said cam extends beyond said body and is adapted to interface with a cam actuator.

8. The apparatus of claim 1, further comprising a thermally conductive, electrically insulating material coupled to said mounting surface.

9. The apparatus of claim 8, wherein said material is adhesively bonded to said mounting surface.

10. The apparatus of claim 1, wherein said body further defines a base adapted to support said body on a printed circuit board, said base defining a contact surface area smaller than a cross sectional area of said body to reduce heat transfer from said body to the printed circuit board.

11. An assembly, comprising:
a printed circuit board;
an electrical component mounted on said printed circuit board; and
a heat sink apparatus in thermal communication with said electrical component and adapted to remove heat therefrom, said heat sink apparatus having a thermally conductive body defining a mounting surface thereon adapted to contact said electrical component, said heat sink apparatus further including a means including a cam rotatably mounted to said body for resiliently holding said electrical component in thermal contact with said mounting surface in an engaged position and for disengaging contact with said electrical component in a disengaged position.

12. The assembly of claim 11, wherein said means is adapted to accommodate electrical components of different sizes.

13. An assembly, comprising:
a printed circuit board;
an electrical component mounted on said printed circuit board; and
a heat sink apparatus in thermal communication with said electrical component and adapted to remove heat therefrom, said heat sink apparatus having a thermally conductive body defining a mounting surface thereon adapted to contact said electrical component, said heat sink apparatus further including a means for resiliently holding said electrical component in thermal contact with said mounting surface in an engaged position and for disengaging contact with said electrical component in a disengaged position; and wherein said means comprises a holding member having a pivot arm portion adapted to engage a rotatable cam positioned in said body, and a flexible spring clip portion adapted to accommodate electrical components of different sizes.

14. The assembly of claim 13, wherein said cam includes a portion adapted to engage said pivot arm to prevent movement from said engaged to said disengaged positions by reverse rotation of said cam.

15. The assembly of claim 13, wherein rotation of said cam to transition said holding member from said disengaged position to said engaged position transitions said pivot arm through a fist arc of a first angle, and wherein said flexible spring clip is likewise transitioned through a second arc that is at most equal to said first arc.

16. The assembly of claim 13, wherein said means further comprises a holding member stop formed perpendicular to said pivot arm, said holding member stop adapted to engage said body to thereby secure said holding member in relation to said cam.

17. The apparatus of claim 13, wherein said cam extends beyond said body and is adapted to interface with a cam actuator.

18. The assembly of claim 11, further comprising a thermally conductive, electrically insulating material affixed to said mounting surface.

19. The assembly of claim 11, wherein said heat sink apparatus further defines a mounting base for supporting said heat sink apparatus on said printed circuit board, said mounting base having a small contact surface area to minimize heat transfer from said body to said printed circuit board.

* * * * *